(12) United States Patent
Cheng et al.

(10) Patent No.: US 9,673,230 B2
(45) Date of Patent: Jun. 6, 2017

(54) PIXEL ARRAY

(71) Applicant: Au Optronics Corporation, Hsinchu (TW)

(72) Inventors: He-Yi Cheng, Kaohsiung (TW); Hsin-Chun Huang, Hsinchu County (TW); Ching-Sheng Cheng, Kaohsiung (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 15/186,552

(22) Filed: Jun. 20, 2016

(65) Prior Publication Data
US 2016/0300855 A1 Oct. 13, 2016

Related U.S. Application Data

(63) Continuation of application No. 14/225,443, filed on Mar. 26, 2014, now abandoned.

(30) Foreign Application Priority Data

Nov. 8, 2013 (TW) .................................. 102140698

(51) Int. Cl.
| | | |
|---|---|---|
| *H01L 27/12* | (2006.01) | |
| *G02F 1/1362* | (2006.01) | |
| *G02F 1/1343* | (2006.01) | |
| *G02F 1/1368* | (2006.01) | |

(52) U.S. Cl.
CPC .......... *H01L 27/124* (2013.01); *G02F 1/1368* (2013.01); *G02F 1/134309* (2013.01); *G02F 1/136227* (2013.01); *G02F 1/136286* (2013.01); *H01L 27/1251* (2013.01); *G02F 2201/123* (2013.01); *G02F 2201/40* (2013.01)

(58) Field of Classification Search
CPC .......... H01L 27/124; H01L 2924/0002; H01L 2924/00; H01L 27/1288; H01L 27/1259; H01L 27/1255; H01L 27/3262; H01L 27/3276
See application file for complete search history.

(56) References Cited

U.S. PATENT DOCUMENTS

2011/0244615 A1* 10/2011 Fang ..................... H01L 29/458
438/34

\* cited by examiner

*Primary Examiner* — Tony Tran
(74) *Attorney, Agent, or Firm* — Jianq Chyun IP Office

(57) ABSTRACT

A pixel array includes a plurality of scan lines, a plurality of data lines, a first active device, a second active device, a first pixel electrode and a second pixel electrode. The first active device and the second active device are electrically connected to the corresponding scan line and data line respectively. The first pixel electrode is electrically connected to the first active device through a contact hole. The second pixel electrode is electrically connected to the second active device through the contact hole.

2 Claims, 13 Drawing Sheets

PIXEL ARRAY

CROSS-REFERENCE TO RELATED APPLICATION

This application is a continuation application of and claims the priority benefit of a prior application Ser. No. 14/225,443, filed on Mar. 26, 2014, now pending. The prior application Ser. No. 14/225,443 claims the priority benefit of Taiwan application serial no. 102140698, filed on Nov. 8, 2013. The entirety of each of the above-mentioned patent applications is hereby incorporated by reference herein and made a part of this specification.

BACKGROUND OF THE INVENTION

Field of the Invention

The invention relates to a pixel array and more particularly relates to a pixel array adapted for a thin-film-transistor liquid-crystal display (TFT-LCD) panel.

Description of Related Art

In recent years, as the flat panel display technology matures, thin-film-transistor liquid-crystal displays become the mainstream in the market of display products due to the advantages of low power consumption, high image quality, good space utilization efficiency, no radiation, light weight, and small size, etc. According to the design of the structure of a thin-film-transistor liquid-crystal display, many dielectric layers (e.g. insulating layer, flat layer, etc.) are disposed between the layer of the drain and the pixel electrode. For this reason, a contact hole is usually formed in the pixel array to achieve electrical connection between the drain and the pixel electrode so that the pixel signal can be properly transmitted from the drain to the pixel electrode.

However, the design rule for forming the contact hole in the TFT-LCD structure is affected by factors such as process equipment and factory process capability, which influence the aperture ratio. Especially in the situation that the contact hole would limit process capability, the configuration of the contact hole will affect the aperture ratio of the pixel structure of the display panel as the resolution of the product continues to improve. Therefore, the pixel array design in the TFT-LCD structure needs to be further improved.

SUMMARY OF THE INVENTION

The invention provides a pixel array that is capable of providing higher resolution and maintaining a favorable aperture ratio with the same process capability.

The invention provides a pixel array which includes a plurality of scan lines, a plurality of data lines, a first active device, a second active device, a first pixel electrode, and a second pixel electrode. The first active device and the second active device are electrically connected to the corresponding scan line and the corresponding data line respectively. The first pixel electrode is electrically connected to the first active device through a contact hole. The second pixel electrode is electrically connected to the second active device through the contact hole.

Based on the above, in the pixel array of the invention, adjacent pixel electrodes are electrically connected to the corresponding active devices through the same contact hole. On the premise of the same process capability, the electrical connection through the common contact hole is conducive to designing a display product having higher resolution (pixel per inch, PPI) and reducing the influence that the area of the contact hole causes to the pixel array substrate.

To make the aforementioned and other features and advantages of the invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain the principles of the invention.

DESCRIPTION OF THE EMBODIMENTS

Figure 1A:
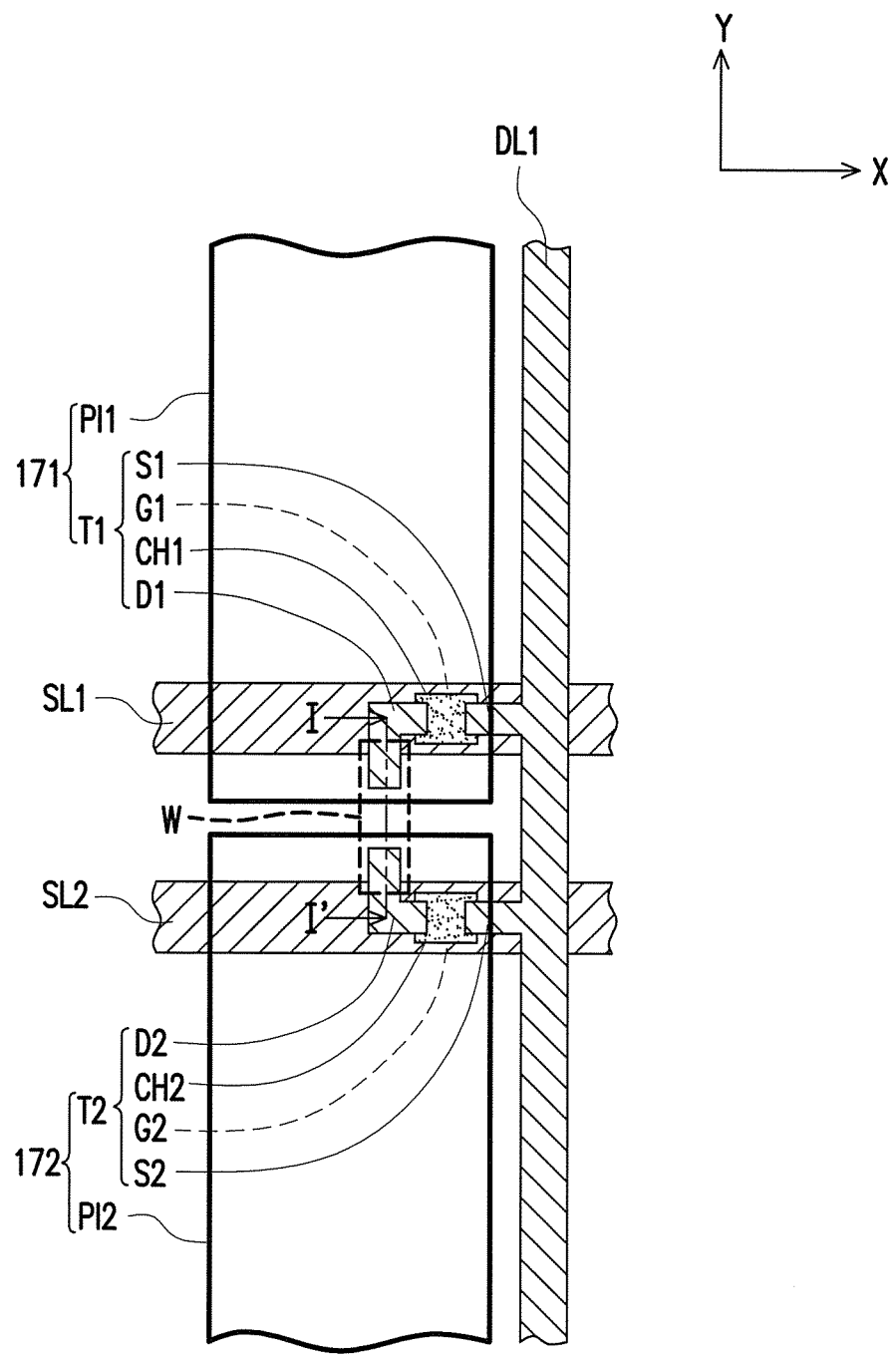
FIG. 1A is a schematic top view of a pixel array according to the first embodiment of the invention.
Figure 1B:
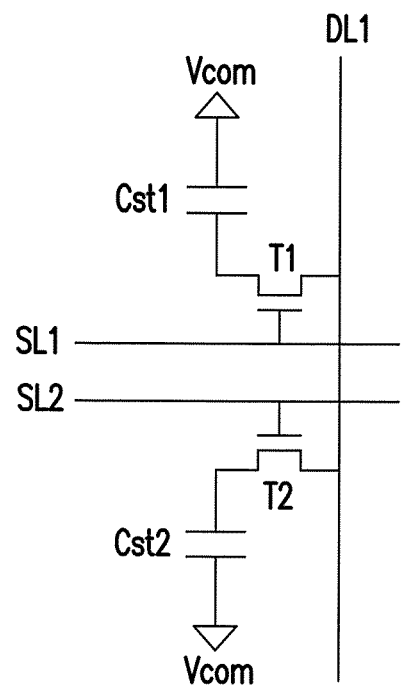
FIG. 1B is an equivalent circuit diagram of the pixel array of FIG. 1A.
Figure 1C:
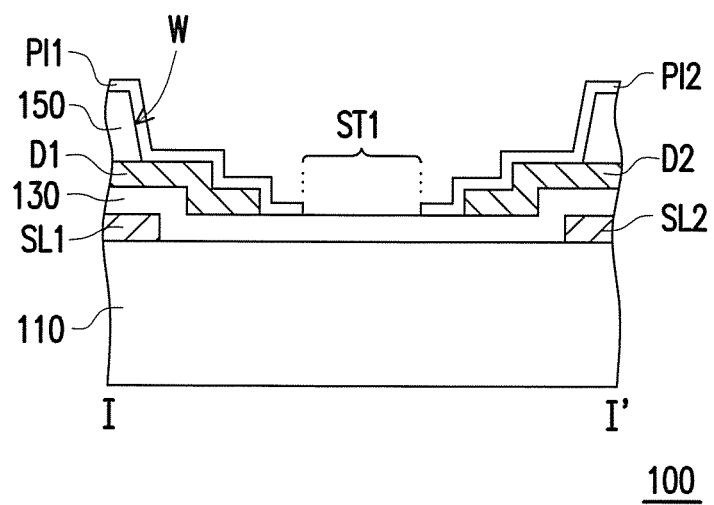
FIG. 1C is a partial cross-sectional view of a pixel array substrate of FIG. 1A along the line I-I'.

FIG. 1A is a schematic top view of a pixel array according to the first embodiment of the invention. FIG. 1B is an equivalent circuit diagram of the pixel array of FIG. 1A. FIG. 1C is a partial cross-sectional view of a pixel array substrate of FIG. 1A along the line I-I'. With reference to FIG. 1A, FIG. 1B, and FIG. 1C, a pixel array substrate 100 includes a substrate 110, a plurality of scan lines SL1 and SL2, an insulating layer 130, a plurality of data lines DL1 (only one is depicted in the figure for clarity), a covering layer 150, and a plurality of pixel structures 171 and 172. For clarity, FIG. 1A, FIG. 1B, and FIG. 1C merely illustrate two of the pixel structures, i.e. 171 and 172, that are adjacent to each other in a Y direction. Those skilled in the art should understand that the pixel array substrate 100 in fact includes multiple pixel structures that are arranged in an array.

A material of the substrate 110 may be, for example, glass, quartz, or plastic. The substrate 110 is mainly used to carry the aforementioned elements.

The scan lines SL1 and SL2 are disposed on the substrate 110, and the insulating layer 130 covers the scan lines SL1 and SL2. The data lines DL1 are disposed on the insulating layer 130, wherein an extending direction of the data lines DL1 and DL2 is different from an extending direction of the scan lines SL1 and SL2. The covering layer 150 covers the data lines DL1.

The pixel structure 171 includes an active device T1 and a pixel electrode PI1 electrically connected to the active device T1. Likewise, the pixel structure 172 includes an active device T2 and a pixel electrode PI2 electrically connected to the active device T2. The active device T1 is driven by the corresponding scan line SL1 and is connected to the corresponding data line DL1. The active device T2 is driven by the corresponding scan line SL2 and is connected to the same data line DL1 as the active device T1. Referring to FIG. 1B, the pixel structures 171 and 172 may further include storage capacitors Cst1 and Cst2. To be more specific, in this embodiment, the active device T1 includes a gate G1, a channel layer CH1, a source S1, and a drain D1. In this embodiment, materials of the gate G1, the scan line SL1, the source S1, and the drain D1 may be metal, such as Al, W, Mo, Ta, Cr, or an alloy thereof. The gate G1 and the scan line SL1 are formed by the same layer. The source S1, the drain D1, and the data line DL1 are formed by the same layer. The scan line SL1 and the data line DL1 are formed by different layers. The gate G1 and the scan line SL1 may be formed in a single one mask process. The source S1, the drain D1, and the data line DL1 may be formed in a single one mask process. The insulating layer 130 is disposed between the scan line SL1 and the data line DL1. An end of the storage capacitor Cst1 is electrically connected to the active device T1, and the other end thereof is electrically connected to a common voltage Vcom. An end of the storage capacitor Cst2 is electrically connected to the active device T2, and the other end thereof is electrically connected to the common voltage Vcom.

The covering layer 150 covers the data lines DL1 and DL2 and the active devices T1 and T2, and the covering layer 150 has a contact hole W. It should be noted that, in this embodiment, the contact hole W overlaps the scan lines SL1 and SL2. However, this disclosure of the invention is not intended to limit the size of the contact hole W, and the contact hole W may not overlap the scan lines SL1 and SL2. In this embodiment, materials of the insulating layer 130 and the covering layer 150 may be an inorganic material (e.g. silicon oxide, silicon nitride, or silicon oxynitride), an organic material, or a stack layer containing multiple insulating materials.

The pixel electrode PI1 is disposed on the covering layer 150 and is in contact with the drain D1 through the contact hole W. The pixel electrode PI2 is disposed on the covering layer 150 and is in contact with the drain D2 through the contact hole W. The pixel electrodes PI1 and PI2 do not contact each other in the contact hole W. A material of the pixel electrodes PI1 and PI2 may be a transparent conductive material, such as indium tin oxide, indium zinc oxide, or aluminum zone oxide (AZO). To be more specific, the scan lines SL1 and SL2 are disposed on the same side with respect to the pixel electrode PI1 or PI2, so as to shorten a distance between the scan lines SL1 and SL2 in the Y direction, thereby electrically connecting the adjacent pixel electrodes PI1 and PI2 respectively to the corresponding drain D1 of the active device T1 and the corresponding drain D2 of the active device T2 through the single contact hole W. In comparison with the conventional pixel array structure, the pixel array of this embodiment improves the aperture ratio with fewer contact holes W.

More specifically, with reference to FIG. 1C, the contact hole W exposes the drain D1 of the active device T1 and the drain D2 of the active device T2. Referring to FIG. 1C, the pixel electrode PI1 and the pixel electrode PI2 respectively cover a portion of a side surface of the contact hole W. In the contact hole W, a gap ST1 exists between the pixel electrodes PI1 and PI2, wherein the pixel electrodes PI1 and PI2 are electrically insulated by the gap ST1. A width of the gap ST1 may be about 2 to 20 micrometers, preferably 2 to 10 micrometers, and more preferably 2 to 8 micrometers. In this embodiment, the design of the electrical connection through the common contact hole W improves the resolution (PPI) of a display product that uses the pixel array substrate 100 of this embodiment and reduces the influence that the area of the contact hole W causes to the pixel array substrate 100.

Figure 2A:
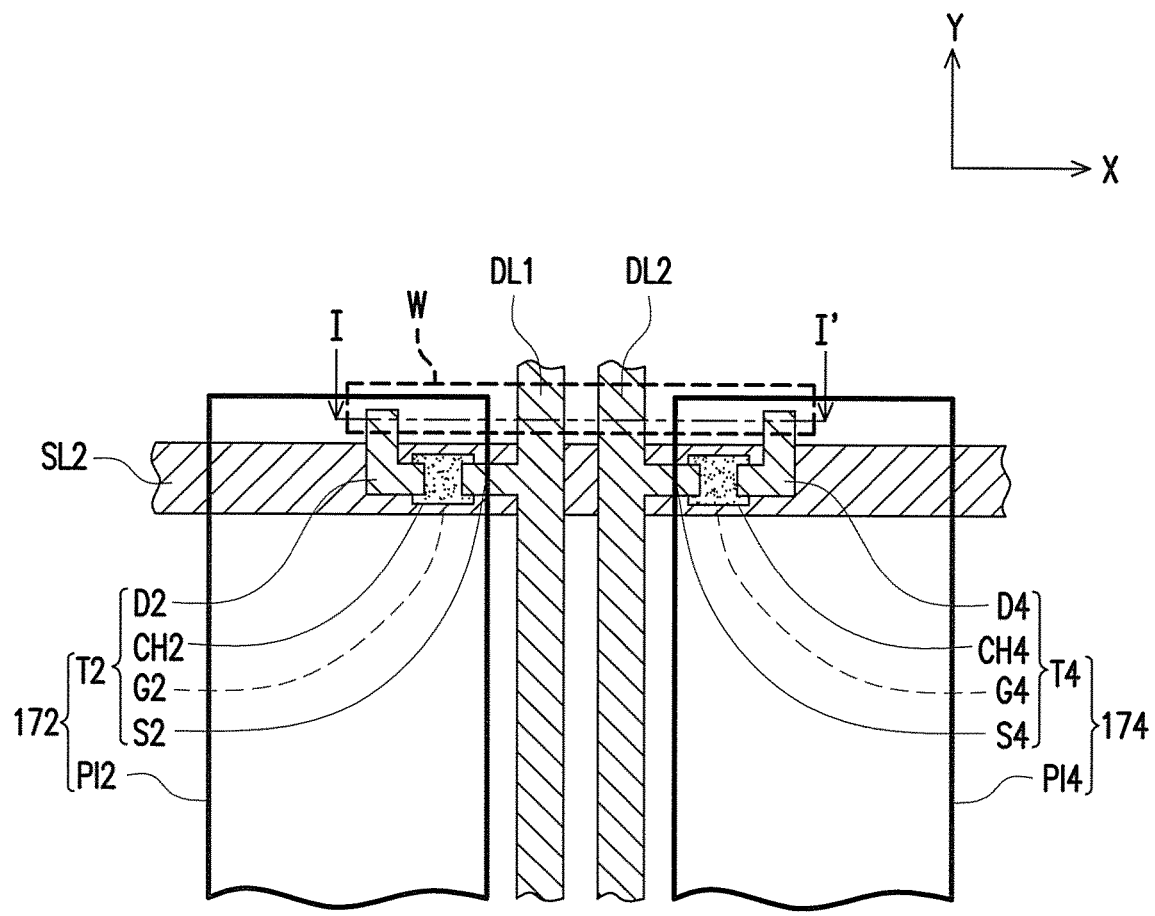
FIG. 2A is a schematic top view of a pixel array according to the second embodiment of the invention.
Figure 2B:
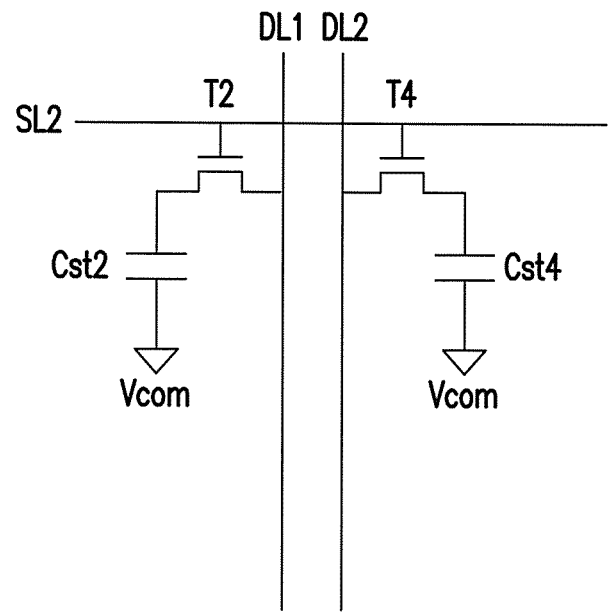
FIG. 2B is an equivalent circuit diagram of the pixel array of FIG. 2A.
Figure 2C:
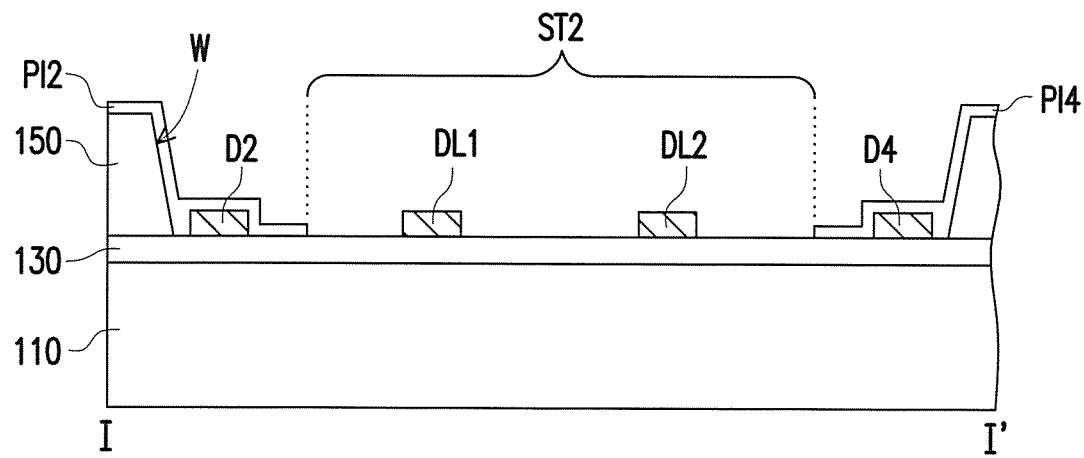
FIG. 2C is a partial cross-sectional view of a pixel array substrate of FIG. 2A along the line I-I'.

FIG. 2A is a schematic top view of a pixel array according to the second embodiment of the invention. FIG. 2B is an equivalent circuit diagram of the pixel array of FIG. 2A. FIG. 2C is a partial cross-sectional view of a pixel array substrate of FIG. 2A along the line I-I'. With reference to FIG. 2A, FIG. 2B, and FIG. 2C, a pixel array substrate 200 is substantially similar to the pixel array substrate 100. Thus, identical elements are denoted by the same reference numerals, and details thereof will not be repeated hereinafter. A difference between the pixel array substrate 200 and the pixel array substrate 100 is as follows. In the second embodiment, the active device T2 and an active device T4 are driven by the same scan line SL2 and are respectively electrically connected to the corresponding data line DL1 and data line DL2. In other words, the active device T4 is electrically connected to the scan line SL2 and the data line DL2. The active device T4 includes a gate G4, a source S4, a drain D4, and a channel layer CH4. Moreover, a pixel electrode PI4 is electrically connected to the active device T4, and the active device T4 is electrically connected to a capacitor Cst4. In addition, in this embodiment, the contact hole W overlaps the data lines DL1 and DL2 and exposes the data lines DL1 and DL2. However, this disclosure of the invention does not limit the size of the contact hole W. To be more specific, the data lines DL1 and DL2 are disposed on the same side with respect to the pixel electrode PI2 or PI4, so as to shorten a distance between the data lines DL1 and DL2 in an X direction, thereby electrically connecting the adjacent pixel electrodes PI2 and PI4 respectively to the corresponding drain D2 of the active device T2 and the corresponding drain D4 of the active device T4 through the same contact hole W. The contact hole W, for example, may not overlap the scan line SL2.

More specifically, with reference to FIG. 2C, the contact hole W exposes the drain D2 of the active device T2, the drain D4 of the active device T4, and the data lines DL1 and DL2. Referring to FIG. 2C, the pixel electrode PI2 and the pixel electrode PI4 respectively cover a portion of the side surface of the contact hole W. In the contact hole W, a gap ST2 exists between the pixel electrodes PI2 and PI4, and a portion of the data lines DL1 and DL2 is located in the gap ST2, wherein the pixel electrodes PI2 and PI4 are electrically insulated by the gap ST2. A width of the gap ST2 may be about 2 to 20 micrometers, preferably 2 to 10 micrometers, and more preferably 2 to 8 micrometers. Likewise, the design of the electrical connection through the common contact hole W improves the resolution (PPI) of a display product that uses the pixel array substrate 200 of this embodiment and reduces the influence that the area of the contact hole W causes to the pixel array substrate 200.

Figure 3A:
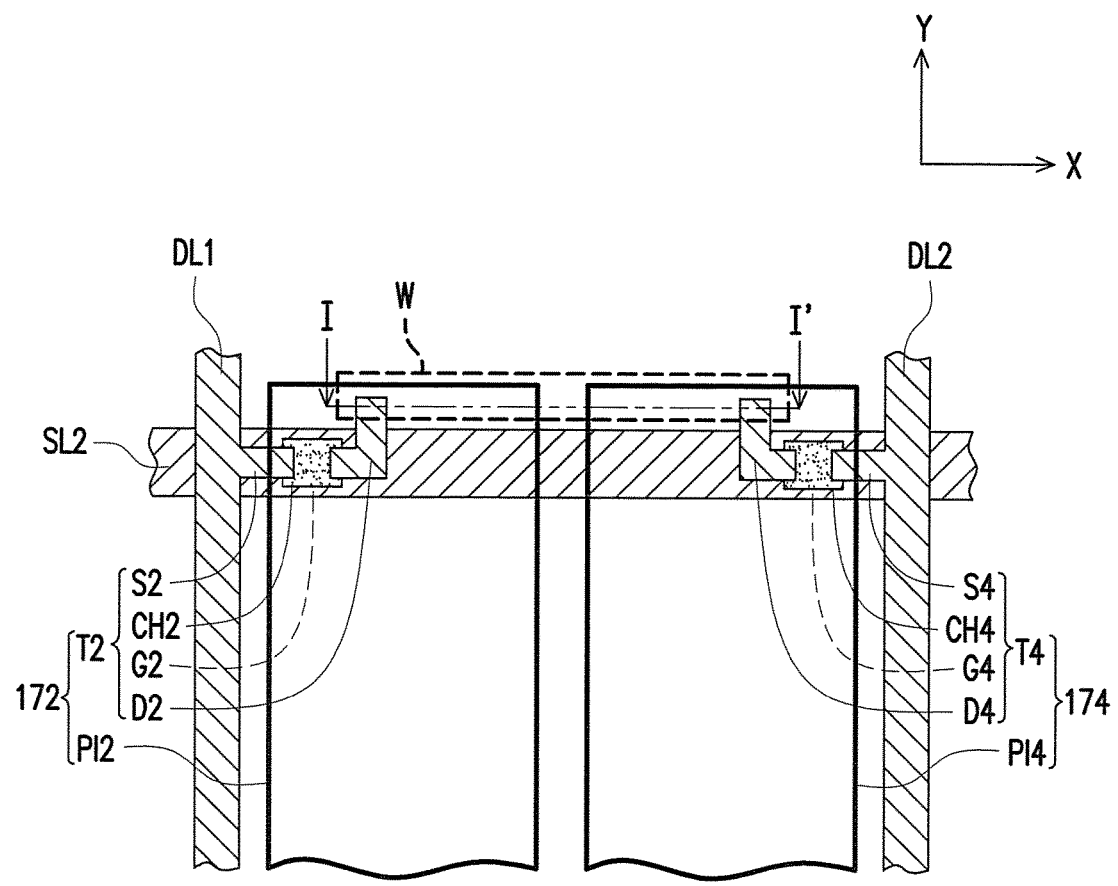
FIG. 3A is a schematic top view of a pixel array according to the third embodiment of the invention.
Figure 3B:
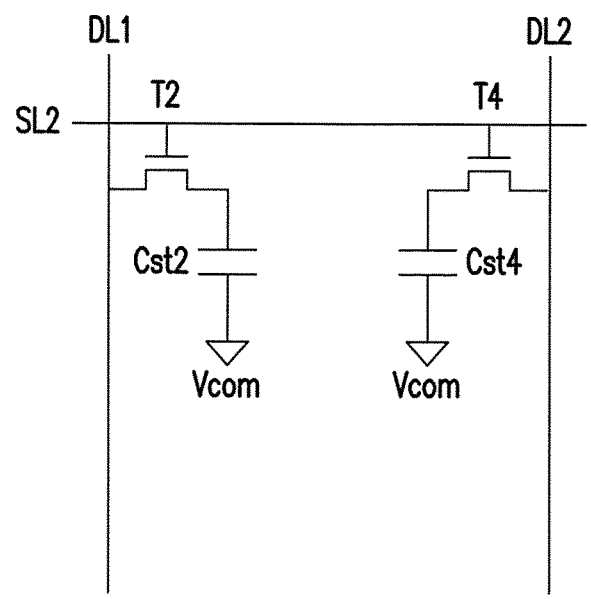
FIG. 3B is an equivalent circuit diagram of the pixel array of FIG. 3A.
Figure 3C:
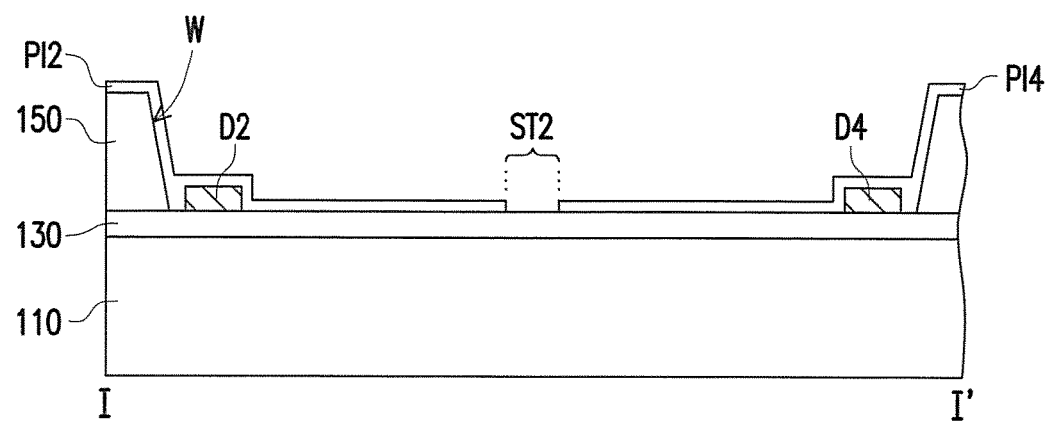
FIG. 3C is a partial cross-sectional view of a pixel array substrate of FIG. 3A along the line I-I'.

FIG. 3A is a schematic top view of a pixel array according to the third embodiment of the invention. FIG. 3B is an equivalent circuit diagram of the pixel array of FIG. 3A. FIG. 3C is a partial cross-sectional view of a pixel array substrate of FIG. 3A along the line I-I'. With reference to FIG. 3A, FIG. 3B, and FIG. 3C, a pixel array substrate 300 is substantially similar to the pixel array substrate 100. Thus, identical elements are denoted by the same reference numerals, and details thereof will not be repeated hereinafter. A difference between the pixel array substrate 300 and the pixel array substrate 100 is as follows. In the third embodiment, the active device T2 and the active device T4 are driven by the same scan line SL2 and are respectively electrically connected to the corresponding data line DL1 and data line DL2. In other words, the active device T4 is electrically connected to the scan line SL2 and the data line DL2. The active device T4 includes the gate G4, the source S4, the drain D4, and the channel layer CH4. Moreover, the pixel electrode PI4 is electrically connected to the active device T4, and the active device T4 is electrically connected to the capacitor Cst4. It is worth mentioning that, in comparison with the pixel array substrate 200, the contact hole W in the pixel array substrate 300 of this embodiment does not overlap the data lines DL1 and DL2, such that the data lines DL1 and DL2 are not exposed by the contact hole W. The contact hole W, for example, may not overlap the scan line SL2. Similarly, the adjacent pixel electrodes PI2 and PI4 are respectively electrically connected to the corresponding drain D2 of the active device T2 and the corresponding drain D4 of the active device T4 through the same contact hole W.

More specifically, with reference to FIG. 3C, the contact hole W exposes the drain D2 of the active device T2 and the drain D4 of the active device T4. Referring to FIG. 3C, the pixel electrode PI2 and the pixel electrode PI4 respectively cover a portion of the side surface of the contact hole W. In the contact hole W, the gap ST2 exists between the pixel electrodes PI2 and PI4, wherein the pixel electrodes PI2 and PI4 are electrically insulated by the gap ST2. A width of the gap ST2 may be about 2 to 20 micrometers, preferably 2 to 10 micrometers, and more preferably 2 to 8 micrometers. Likewise, the design of the electrical connection through the common contact hole W improves the resolution (PPI) of a display product that uses the pixel array substrate 300 of this embodiment and reduces the influence that the area of the contact hole W causes to the pixel array substrate 300.

Figure 4A:
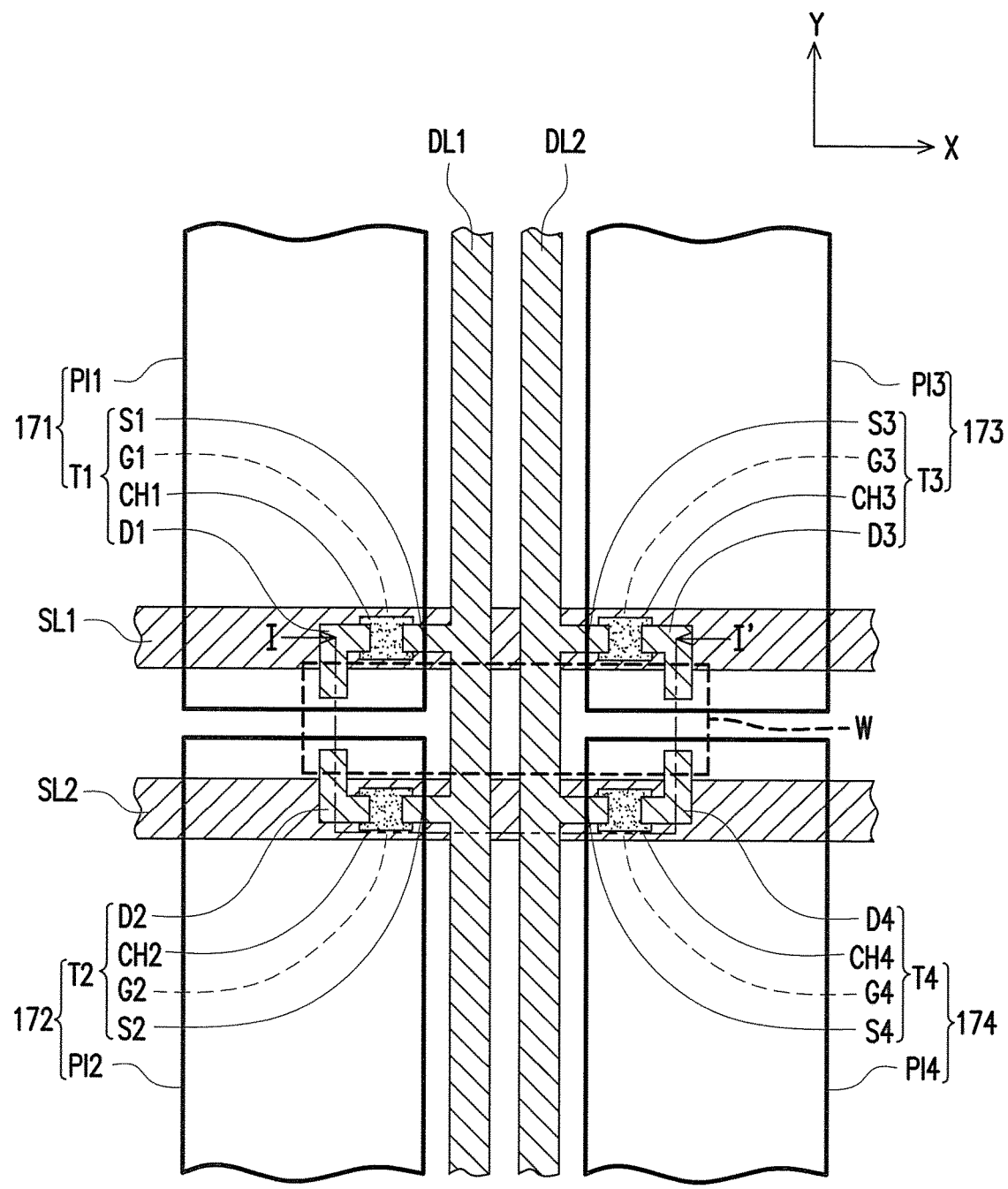
FIG. 4A is a schematic top view of a pixel array according to the fourth embodiment of the invention.
Figure 4B:
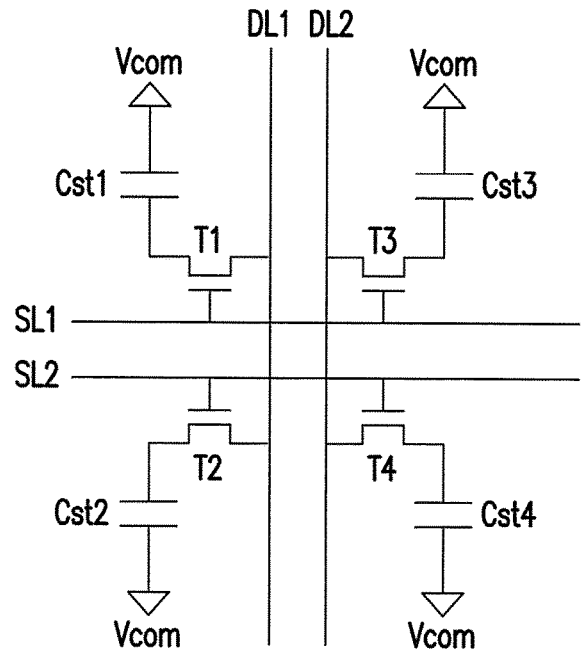
FIG. 4B is an equivalent circuit diagram of the pixel array of FIG. 4A.
Figure 4C:
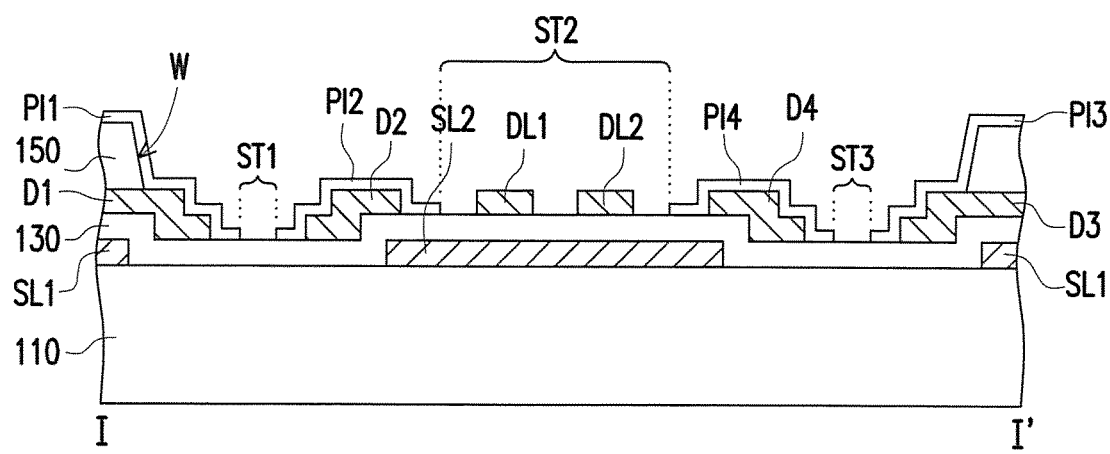
FIG. 4C is a partial cross-sectional view of a pixel array substrate of FIG. 4A along the line I-I'.

FIG. 4A is a schematic top view of a pixel array according to the fourth embodiment of the invention. FIG. 4B is an equivalent circuit diagram of the pixel array of FIG. 4A. FIG. 4C is a partial cross-sectional view of a pixel array substrate of FIG. 4A along the line I-I'. With reference to FIG. 4A, FIG. 4B, and FIG. 4C, a pixel array substrate 400 is substantially similar to the pixel array substrate 100. Thus, identical elements are denoted by the same reference numerals, and details thereof will not be repeated hereinafter. A difference between the pixel array substrate 400 and the pixel array substrate 100 is as follows. In the fourth embodiment, four adjacent pixel structures 171, 172, 173, and 174 share the contact hole W. To be more specific, the active devices T1 and T2 are respectively driven by the scan lines SL1 and SL2 and are electrically connected to the same data line DL1. The active devices T3 and T4 are respectively driven by the scan lines SL1 and SL2 and are electrically connected to the same data line DL2. In other words, the active devices T1 and T3 are driven by the same scan line SL1 and are electrically connected to the corresponding data lines DL1 and DL2 respectively. The active devices T2 and T4 are driven by the same scan line SL2 and are electrically connected to the data lines DL1 and DL2 respectively. Moreover, the active device T3 is electrically connected to the scan line SL1 and the data line DL2. The active device T3 includes a gate G3, a source S3, a drain D3, and a channel layer CH3. A pixel electrode PI3 is electrically connected to the active device T3, and the active device T3 is electrically connected to a capacitor Cst3. The data lines DL1 and DL2 are disposed on the same side with respect to the pixel electrode PI1 or PI3, and the scan lines SL1 and SL2 are disposed on the same side with respect to the pixel electrode PI1 or PI2, so as to shorten the distance between the data lines DL1 and DL2 in the X direction and the distance between the scan lines SL1 and SL2 in the Y direction, thereby electrically connecting the adjacent pixel electrodes PI1, PI2, PI3, and PI4 respectively to the corresponding drain D1 of the active device T1, the corresponding drain D2 of the active device T2, the corresponding drain D3 of the active device T3, and the corresponding drain D4 of the active device T4 through the single contact hole W.

Furthermore, in this embodiment, the contact hole W overlaps the data lines DL1 and DL2, and as shown in FIG. 4C, the contact hole W exposes the drain D1 of the active device T1, the drain D2 of the active device T2, the drain D3 of the active device T3, the drain D4 of the active device T4, and the data lines DL1 and DL2. However, the invention does not limit the size of the contact hole W. Referring to FIG. 4A and FIG. 4C, the pixel electrodes PI1, PI2, PI3, and PI4 respectively cover a portion of the side surface of the contact hole W. In the contact hole W, the gap ST1 exists between the pixel electrodes PI1 and PI2, the gap ST2 exists between the pixel electrodes PI2 and PI4, and a gap ST3 exists between the pixel electrodes PI3 and PI4. Moreover, a portion of the data lines DL1 and DL2 is located in the gap ST2. The pixel electrodes PI1 and PI2 are electrically insulated by the gap ST1, the pixel electrodes PI2 and PI4 are electrically insulated by the gap ST2, and the pixel electrodes PI3 and PI4 are electrically insulated by the gap ST3. A width of the gap ST1, ST2, and ST3 may be about 2 to 20 micrometers, preferably 2 to 10 micrometers, and more preferably 2 to 8 micrometers respectively. On the premise of the same process capability, the design of the electrical connection through the common contact hole W improves the resolution (PPI) of a display product (e.g. mobile phone, flat panel display, TV, or notebook computer) that uses the pixel array substrate 400 of this embodiment from 315 ppi to 335 ppi.

Figure 5A:
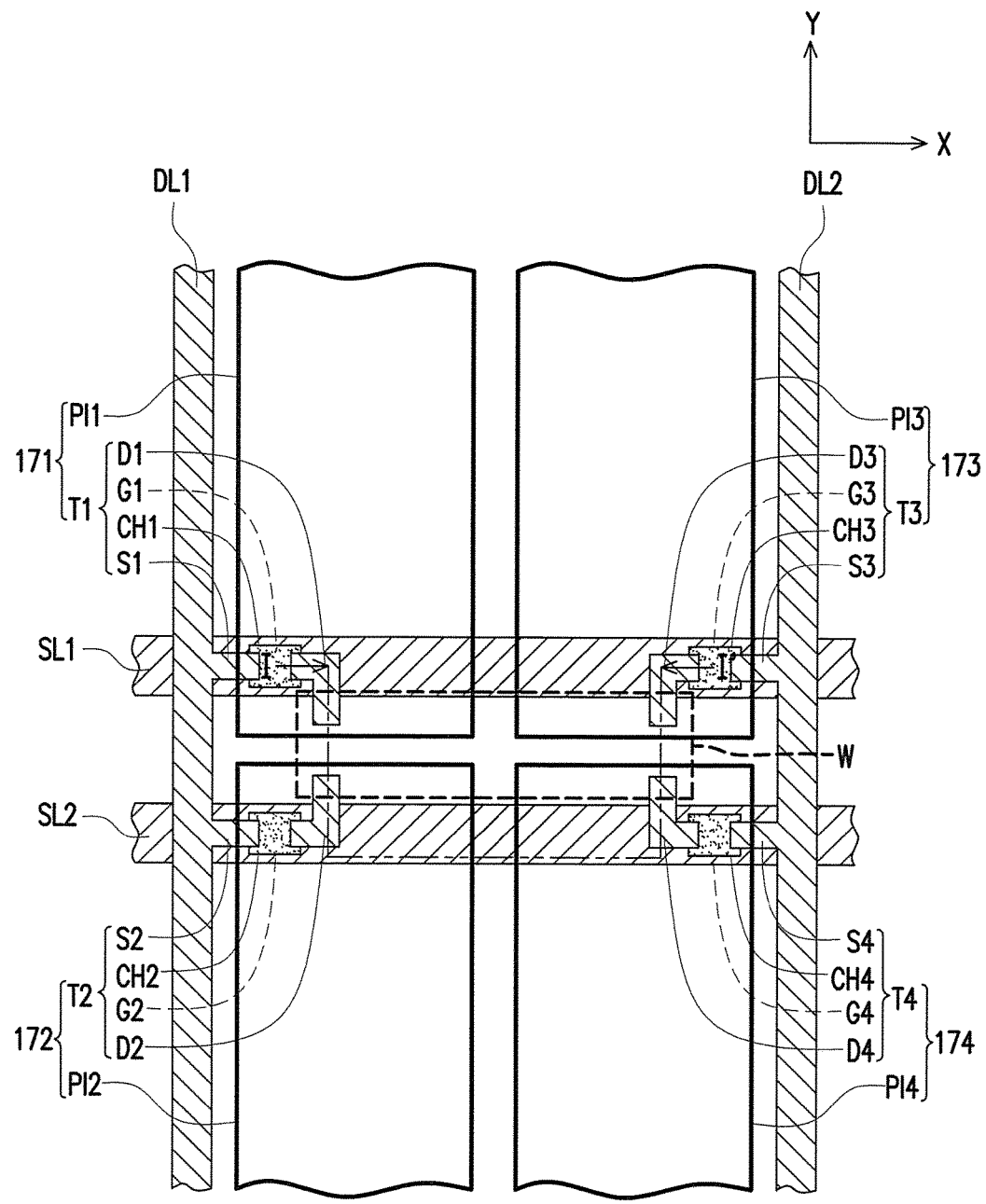
FIG. 5A is a schematic top view of a pixel array according to the fifth embodiment of the invention.
Figure 5B:
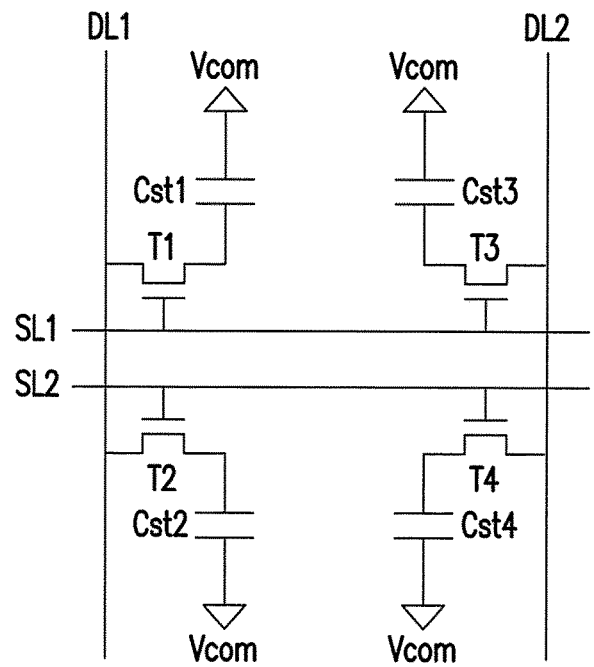
FIG. 5B is an equivalent circuit diagram of the pixel array of FIG. 5A.
Figure 5C:
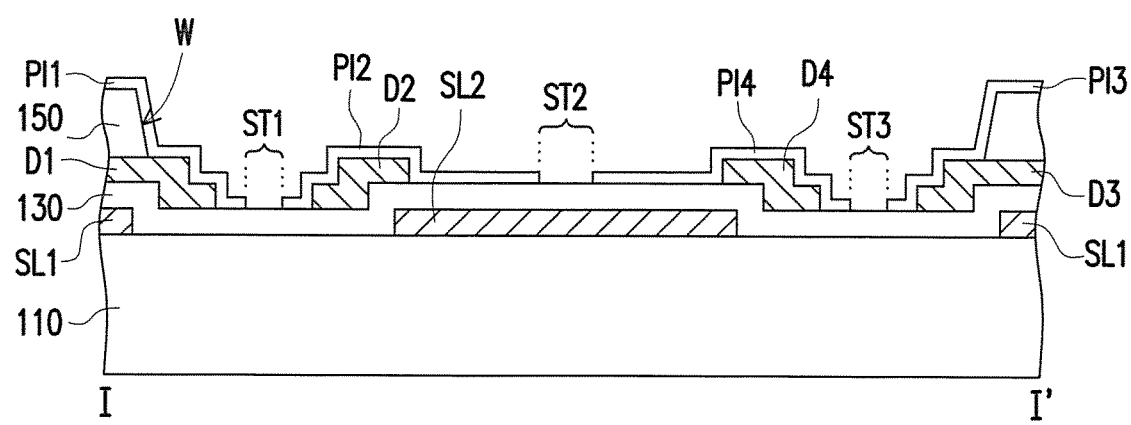
FIG. 5C is a partial cross-sectional view of a pixel array substrate of FIG. 5A along the line I-I'.

FIG. 5A is a schematic top view of a pixel array according to the fifth embodiment of the invention. FIG. 5B is an equivalent circuit diagram of the pixel array of FIG. 5A. FIG. 5C is a partial cross-sectional view of a pixel array substrate of FIG. 5A along the line I-I'. With reference to FIG. 5A, FIG. 5B, and FIG. 5C, a pixel array substrate 500 is substantially similar to the pixel array substrate 100. Thus, identical elements are denoted by the same reference numerals, and details thereof will not be repeated hereinafter. A difference between the pixel array substrate 500 and the pixel array substrate 100 is as follows. In the fifth embodiment, four adjacent pixel structures 171, 172, 173, and 174 share the contact hole W. To be more specific, the active devices T1 and T2 are respectively driven by the scan lines SL1 and SL2 and are electrically connected to the same data line DL1. The active devices T3 and T4 are respectively driven by the scan lines SL1 and SL2 and are electrically connected to the same data line DL2. In other words, the active devices T1 and T3 are driven by the same scan line SL1 and are electrically connected to the corresponding data lines DL1 and DL2 respectively. The active devices T2 and T4 are driven by the same scan line SL2 and are electrically connected to the data lines DL1 and DL2 respectively. Moreover, the active device T3 is electrically connected to the scan line SL1 and the data line DL2. The active device T3 includes the gate G3, the source S3, the drain D3, and the channel layer CH3. The pixel electrode PI3 is electrically connected to the active device T3, and the active device T3 is electrically connected to the capacitor Cst3. The scan lines SL1 and SL2 are disposed on the same side with respect to the pixel electrode PI1 or PI2, so as to shorten the distance between the scan lines SL1 and SL2 in the Y direction, thereby electrically connecting the adjacent pixel electrodes PI1, PI2, PI3, and PI4 respectively to the corresponding drain D1 of the active device T1, the corresponding drain D2 of the active device T2, the corresponding drain D3 of the active device T3, and the corresponding drain D4 of the active device T4 through the same contact hole W.

It is worth mentioning that, in comparison with the pixel array substrate 400, the contact hole W in the pixel array substrate 500 of this embodiment does not overlap the data lines DL1 and DL2, such that the data lines DL1 and DL2 are not exposed by the contact hole W. As shown in FIG. 5C, the contact hole W exposes the drain D1 of the active device T1, the drain D2 of the active device T2, the drain D3 of the active device T3, and the drain D4 of the active device T4. However, the invention does not the size of the contact hole W. Further, referring to FIG. 5A and FIG. 5C, the pixel electrodes PI1, PI2, PI3, and PI4 respectively cover a portion of the side surface of the contact hole W. In the contact hole W, the gap ST1 exists between the pixel electrodes PI1 and PI2, the gap ST2 exists between the pixel electrodes PI2 and PI4, and the gap ST3 exists between the pixel electrodes PI3 and PI4. The pixel electrodes PI1 and PI2 are electrically insulated by the gap ST1, the pixel electrodes PI2 and PI4 are electrically insulated by the gap ST2, and the pixel electrodes PI3 and PI4 are electrically insulated by the gap ST3. A width of the gap ST1, ST2, and ST3 may be 2 to 20 micrometers, preferably 2 to 10 micrometers, and more preferably 2 to 8 micrometers respectively. On the premise of the same process capability, the design of the electrical connection through the common contact hole W improves the resolution (PPI) of a display product (e.g. mobile phone, flat panel display, TV, or notebook computer) that uses the pixel array substrate 500 of this embodiment from 315 ppi to 335 ppi.

Figure 6A:
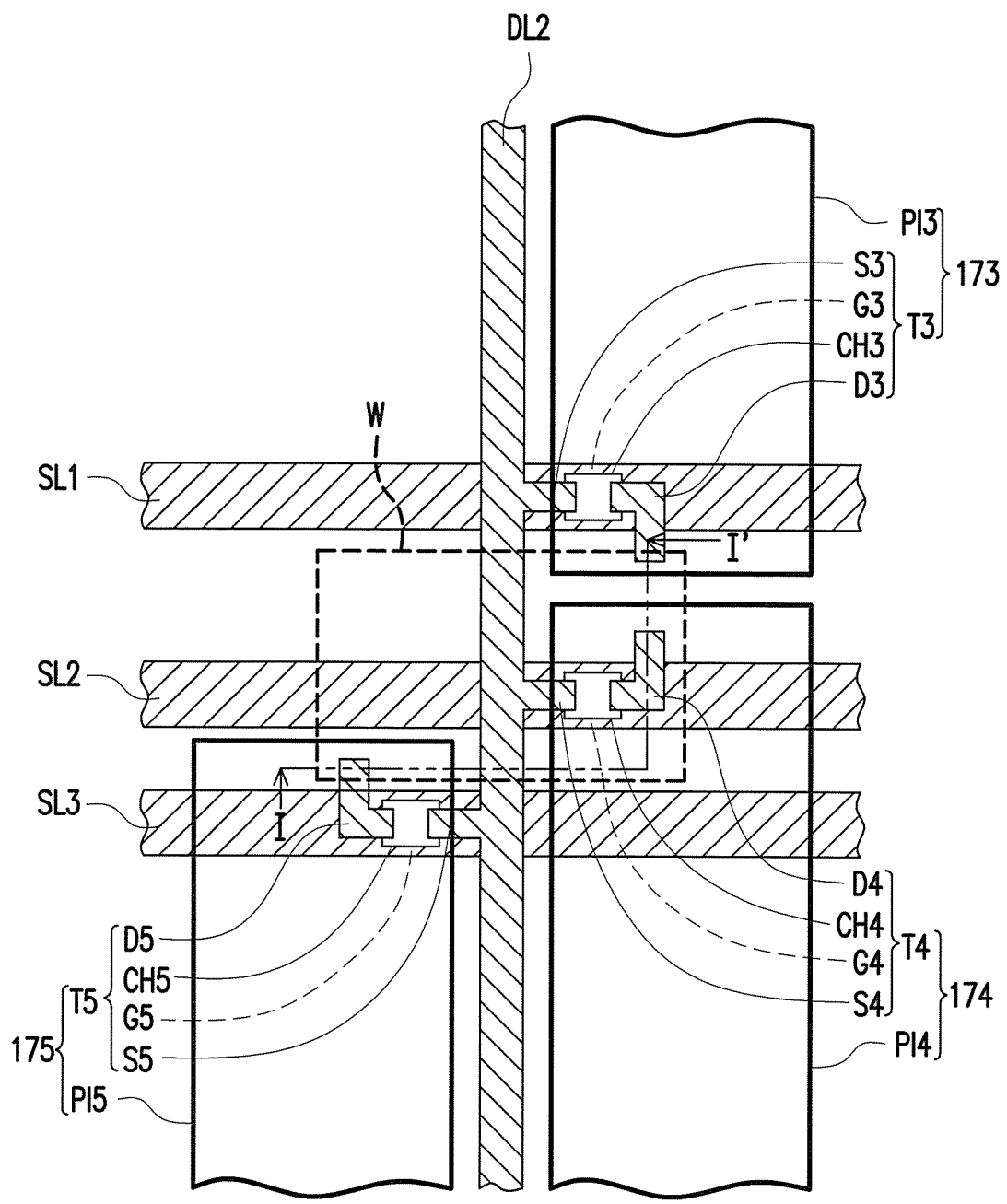
FIG. 6A is a schematic top view of a pixel array according to the sixth embodiment of the invention.
Figure 6B:
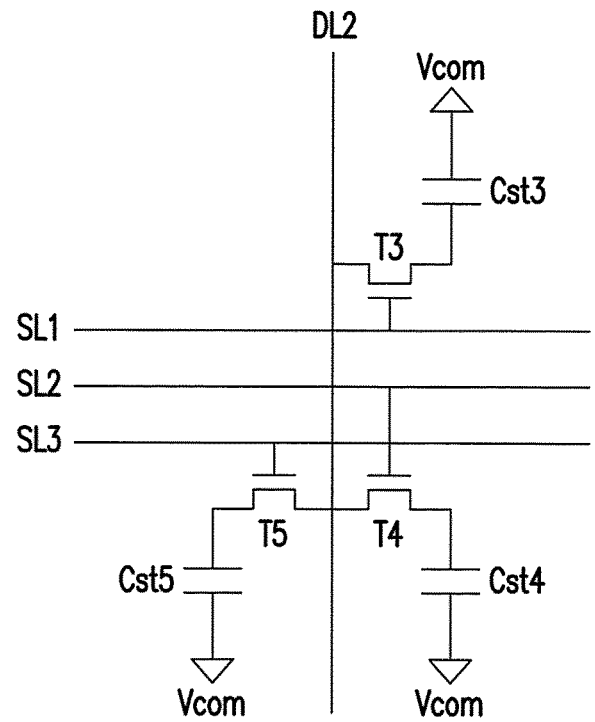
FIG. 6B is an equivalent circuit diagram of the pixel array of FIG. 6A.
Figure 6C:
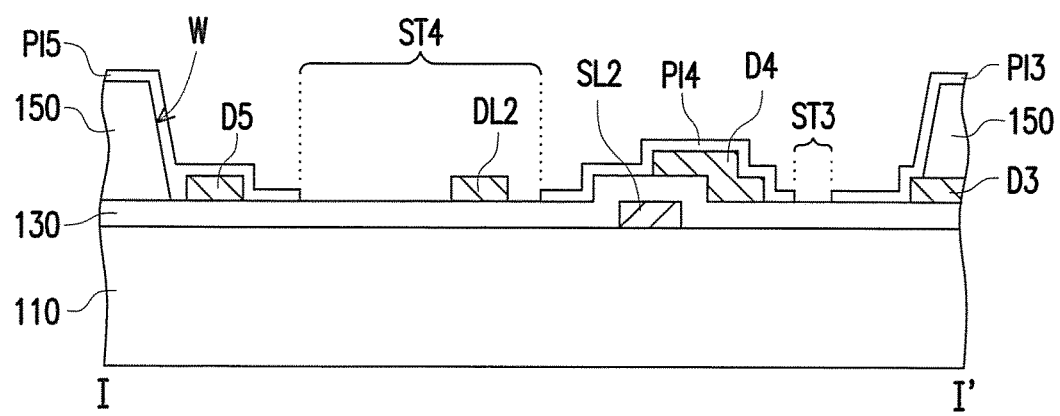
FIG. 6C is a partial cross-sectional view of a pixel array substrate of FIG. 6A along the line I-I'.

FIG. 6A is a schematic top view of a pixel array according to the sixth embodiment of the invention. FIG. 6B is an equivalent circuit diagram of the pixel array of FIG. 6A. FIG. 6C is a partial cross-sectional view of a pixel array substrate of FIG. 6A along the line I-I'. With reference to FIG. 6A, FIG. 6B, and FIG. 6C, a pixel array substrate 600 is substantially similar to the pixel array substrate 100. Thus, identical elements are denoted by the same reference numerals, and details thereof will not be repeated hereinafter. The sixth embodiment of the invention is different from the above three embodiments mainly in the following aspects. In this embodiment, three adjacent pixel structures 173, 174, and 175 share the contact hole W. Active devices T3, T4, and T5 that are adjacent in the X direction and the Y direction are electrically connected to the same data line DL2 and are respectively driven by the scan lines SL1, SL2, and SL3. The active device T5 includes a gate G5, a source S5, a drain D5, and a channel layer CH5. A pixel electrode PI5 is electrically connected to the active device T5, and the active device T5 is electrically connected to a capacitor Cst5. The scan lines SL1, SL2, and SL3 are disposed on the same side with respect to the pixel electrode PI3 or PI4, so as to shorten a distance between the scan lines SL1, SL2, and SL3 in the Y direction, thereby electrically connecting the adjacent pixel electrodes PI3, PI4, and PI5 respectively to the corresponding drain D3 of the active device T3, the corresponding drain D4 of the active device T4, and the corresponding drain D5 of the active device T5 through the same contact hole W. It is worth mentioning that the contact hole W of the pixel array substrate 600 of this embodiment is rectangular; however, the invention is not limited thereto. The shape of the contact hole W may be varied, e.g. L-shaped, as required.

More specifically, with reference to FIG. 6C, the contact hole W overlaps the data line DL2 and exposes the drain D3 of the active device T3, the drain D4 of the active device T4, the drain D5 of the active device T5, and the data line DL2. Further, referring to FIG. 6A and FIG. 6C, the pixel electrodes PI3, PI4, and PI5 respectively cover a portion of the side surface of the contact hole W. In the contact hole W, the gap ST3 exists between the pixel electrodes PI3 and PI4, and a gap ST4 exists between the pixel electrodes PI4 and PI5. A portion of the data line DL2 is located in the gap ST4. The pixel electrodes PI3 and PI4 are electrically insulated by the gap ST3, and the pixel electrodes PI4 and PI5 are electrically insulated by the gap ST4. A width of the gap ST3 or ST4 may be about 2 to 20 micrometers, preferably 2 to 10 micrometers, and more preferably 2 to 8 micrometers. Likewise, the design of the electrical connection through the common contact hole W improves the resolution (PPI) of a display product that uses the pixel array substrate 600 of this embodiment and reduces the influence that the area of the contact hole W causes to the pixel array substrate 600.

Figure 7:
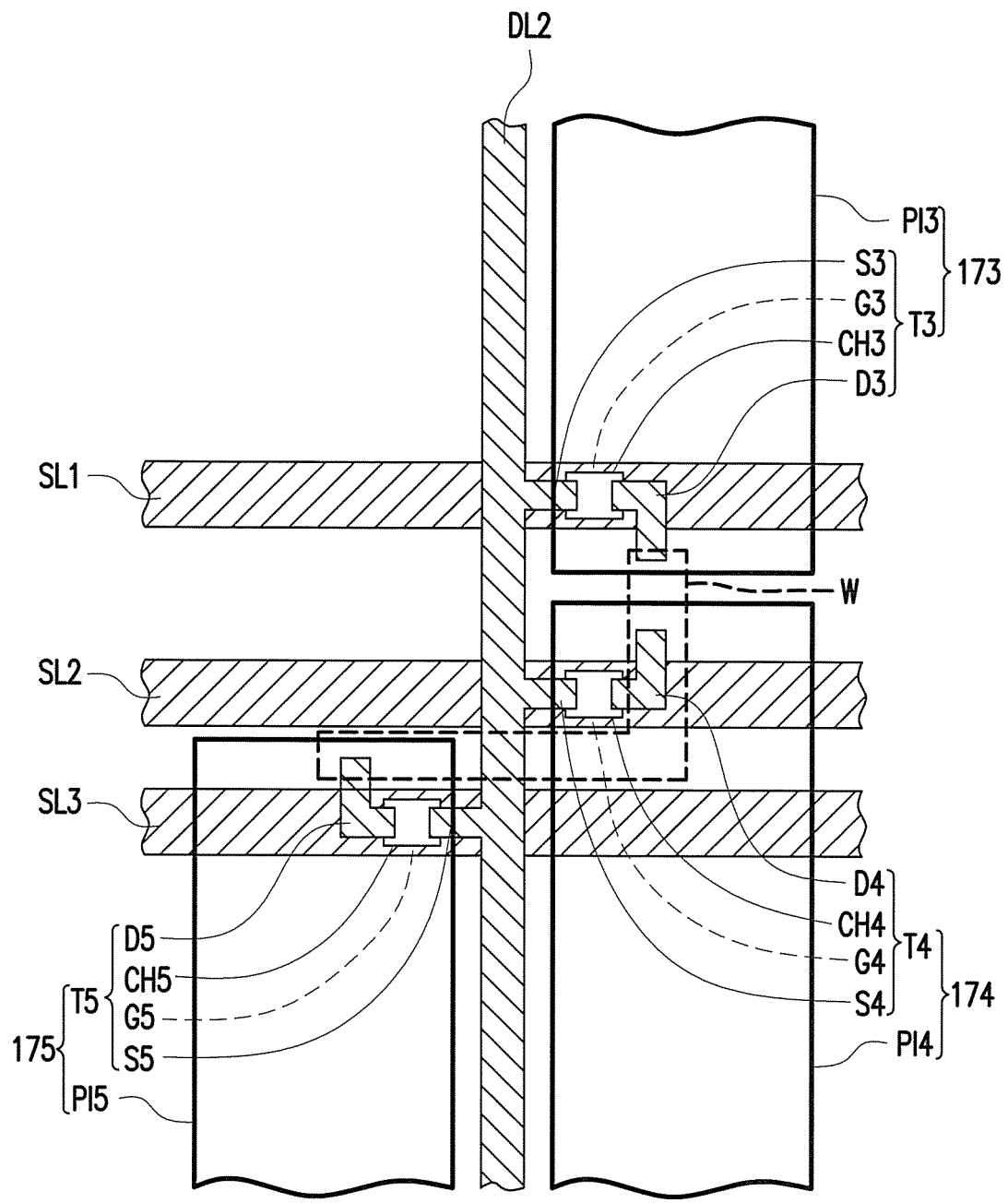
FIG. 7 is a schematic top view of a pixel array according to the seventh embodiment of the invention.

FIG. 7 is a schematic top view of a pixel array according to the seventh embodiment of the invention. A pixel array substrate 700 is substantially similar to the pixel array substrate 600. Thus, identical elements are denoted by the same reference numerals, and details thereof will not be repeated hereinafter. The only difference between the pixel array substrate 700 and the pixel array substrate 600 lies in the shape of the contact hole W shared by the pixel electrodes PI3, PI4, and PI5. In the pixel array substrate 700, the shared contact hole W is L-shaped. Likewise, the design of the electrical connection through the common contact hole W improves the resolution (PPI) of a display product that uses the pixel array substrate 700 of this embodiment and reduces the influence that the area of the contact hole W causes to the pixel array substrate 700.

To sum up, in the pixel array of the invention, the scan lines or data lines or both, which correspond to adjacent pixel electrodes, are disposed on the same side to shorten the distance between the scan lines or data lines, thereby electrically connecting the adjacent pixel electrodes to the corresponding active devices respectively through the same contact hole. On the premise of the same process capability, the electrical connection through the common contact hole is conducive to designing a display product having higher resolution (PPI) and reducing the influence that the area of the contact hole causes to the pixel array substrate. The pixel array of the invention is applicable to a liquid crystal display, such as a twisted nematic liquid crystal display, a vertical alignment type liquid crystal display, a polymer stabilized liquid crystal display, a fringe field switching liquid crystal display, or a lateral electric field-effect type liquid crystal display, and is also applicable to an electroluminescent display, such as an organic light-emitting diode display, etc.

However, application of the invention is not limited thereto. The pixel arrays disclosed in the embodiments of the invention may be applied to any display that is used with a pixel array.

It will be apparent to those skilled in the art that various modifications and variations can be made to the disclosed embodiments without departing from the scope or spirit of the invention. In view of the foregoing, it is intended that the invention covers modifications and variations of this disclosure provided that they fall within the scope of the following claims and their equivalents.

What is claimed is:

1. A pixel array, comprising:
a plurality of scan lines and a plurality of data lines;
a first active device, a second active device, a third active device, and a fourth active device respectively electrically connected to one of the scan lines and one of data lines corresponding thereto, wherein the first active device and the second active device are respectively electrically connected to two different scan lines, the first active device and the second active device are electrically connected to the same data line, a drain of the first active device extends not toward the same data line, a drain of the second active device extends not toward the same data line, the drain of the first active device extends toward one of the two different scan lines and the second pixel electrode, and the drain of the second active device extends toward the first pixel electrode;
a first pixel electrode electrically connected to the first active device through a contact hole, wherein the contact hole is not overlapped with the plurality of data lines;
a second pixel electrode electrically connected to the second active device through the contact hole, wherein the two different scan lines are substantially located between a portion of the first pixel electrode and a portion of the second pixel electrode, and a width of a gap formed completely within a vertical projection area of the contact hole and between the first pixel electrode and the second pixel electrode is about 2 to 10 micrometers;
a third pixel electrode electrically connected to the third active device through the contact hole; and
a fourth pixel electrode electrically connected to the fourth active device through the contact hole, wherein the fourth active device and the second active device are electrically connected to same scan line, the third active device and the fourth active device are electrically connected to same data line, the drain of the third active device extends toward the fourth pixel electrode, and the drain of the fourth active device extends toward the third pixel electrode.

2. A pixel array, comprising:
a plurality of scan lines and a plurality of data lines;
a first active device, a second active device, a third active device, and a fourth active device respectively electrically connected to one of the scan lines and one of data lines corresponding thereto, wherein the first active device and the second active device are respectively electrically connected to two adjacent scan lines, the first active device and the second active device are electrically connected to the same data line, a drain of the first active device extends not toward the same data line, a drain of the second active device extends not toward the same data line, the drain of the first active device extends toward one of the two different scan lines and the second pixel electrode, the drain of the second active device extends toward the first pixel electrode;
a first pixel electrode electrically connected to the first active device through a contact hole, the contact hole is not overlapped with the plurality of data lines;
a second pixel electrode electrically connected to the second active device through the contact hole, wherein both of an edge of the first pixel electrode and an edge of the second pixel electrode are located between the two adjacent scan lines, and a width of a gap formed completely within a vertical projection area of the contact hole and between the first pixel electrode and the second pixel electrode is about 2 to 10 micrometers;
a third pixel electrode electrically connected to the third active device through the contact hole; and
a fourth pixel electrode electrically connected to the fourth active device through the contact hole, wherein the fourth active device and the second active device are electrically connected to same scan line, the third active device and the fourth active device are electrically connected to same data line, the drain of the third active device extends toward the fourth pixel electrode, and the drain of the fourth active device extends toward the third pixel electrode.

* * * * *